United States Patent
Harris et al.

(10) Patent No.: US 7,635,888 B2
(45) Date of Patent: Dec. 22, 2009

(54) INTERDIGITATED CAPACITORS

(75) Inventors: Edward B. Harris, Fogelsville, PA (US); Canzhong He, Emmaus, PA (US); Che Choi Leung, Bethlehem Township, Northampton County, PA (US); Bruce W. McNeill, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 524 days.

(21) Appl. No.: 11/265,062

(22) Filed: Nov. 2, 2005

(65) Prior Publication Data
US 2006/0054994 A1 Mar. 16, 2006

Related U.S. Application Data

(62) Division of application No. 10/886,763, filed on Jul. 8, 2004, now Pat. No. 7,022,581.

(51) Int. Cl.
*H01L 27/108* (2006.01)
*H01L 29/76* (2006.01)
*H01L 29/94* (2006.01)
*H01L 31/119* (2006.01)

(52) U.S. Cl. .............. 257/307; 257/532; 257/E27.086

(58) Field of Classification Search ............... 257/297, 257/303, 306, 307, E27.064, E27.086, E21.648
See application file for complete search history.

(56) References Cited

U.S. PATENT DOCUMENTS

| 5,126,280 | A | * | 6/1992 | Chan et al. | 438/253 |
| 5,192,703 | A | * | 3/1993 | Lee et al. | 438/396 |
| 2002/0076894 | A1 | * | 6/2002 | Hori et al. | 438/396 |
| 2003/0089941 | A1 | * | 5/2003 | Baker et al. | 257/309 |
| 2003/0113967 | A1 | * | 6/2003 | Allman et al. | 438/253 |
| 2004/0046230 | A1 | * | 3/2004 | Bernstein et al. | 257/528 |
| 2004/0219757 | A1 | * | 11/2004 | Olewine et al. | 438/381 |

\* cited by examiner

*Primary Examiner*—Thien F Tran

(57) ABSTRACT

The specification describes matched capacitor pairs that employ interconnect metal in an interdigitated form, and are made with an area efficient configuration. In addition, structural variations between capacitors in the capacitor pair are minimized to provide optimum matching. According to the invention, the capacitor pairs are interdigitated in a manner that ensures that the plates of each pair occupy common area on the substrate. Structural anomalies due to process conditions are compensated in that a given anomaly affects both capacitors in the same way. Two of the capacitor plates, one in each pair, are formed of comb structures, with the fingers of the combs interdigitated. The other plates are formed using one or more plates interleaved between the interdigitated plates.

14 Claims, 6 Drawing Sheets

INTERDIGITATED CAPACITORS

RELATED APPLICATIONS

This application is a division of application Ser. No. 10/886,763 filed Jul. 8, 2004 now U.S. Pat. No. 7,022,581.

FIELD OF THE INVENTION

This invention relates to capacitors for integrated circuits.

BACKGROUND OF THE INVENTION

A simple and cost-effective way of forming capacitors for integrated circuits is to use side-by-side runners of interconnect metal. To enhance capacitor area the runners may be interdigitated. See U.S. Pat. No. 6,383,858, issued May 7, 2002, and incorporated herein by reference. Since the capacitor dielectric may be formed by the interlevel dielectric of the integrated circuit (IC) these passive devices can be formed with no additional IC processing steps. Capacitance may be further increased by stacking interdigitated structures in a multi-level configuration. (See the patent referenced above).

Capacitors of this type may be integrated with active devices in a conventional integrated circuit, or may comprise portions of integrated passive devices (IPDs), where the capacitors are combined with inductors, resistors etc., to form a passive device network. IPDs typically are formed on high resistivity substrates and may have no active elements. In either case, capacitors are commonly used in pairs or other groupings.

For some IC applications, paired capacitors are required to have equivalent electrical characteristics. The straightforward method to obtain matched capacitor pairs is to form them with identical structures using the same processing steps. While that approach is largely successful, precise matching of capacitors, even when formed side-by-side on a substrate wafer, may not result. This is often due to dimensional variations in the runners, or the dielectric. These variations occur in both the thickness dimension, for example, the interlevel dielectric thickness, and in the lateral dimension, and are typically attributed to processing conditions. The thickness dimension is usually thought of as the z-direction, with the lateral dimension(s) corresponding to the x-y plane of the substrate wafer. Capacitor pair mismatch commonly occurs due to localized thickness variations in the metal runners from one capacitor structure to another.

BRIEF STATEMENT OF THE INVENTION

We have developed a new capacitor structure that employs interconnect metal in an interdigitated form, but provides additional simplification when capacitors are used in pairs. In addition, it significantly reduces structural variations between capacitors in a capacitor pair. According to the invention, paired capacitors are formed in an interdigitated configuration, in a manner that ensures that the plates of each pair occupy common area on the substrate. The interdigitated structure is laid-out such that structural anomalies due to process conditions are compensated in that a given anomaly affects both capacitors in the same way. Two of the capacitor plates, one plate for each of the matched pair of capacitors, are formed with electrically conductive comb structures, with the fingers of the combs interdigitated. The other plates for each of the capacitors are formed using one or more conductive runner structures interleaved between the interdigitated plates.

BRIEF DESCRIPTION OF THE DRAWING

The invention may be better understood when considered in conjunction with the drawing in which.

DETAILED DESCRIPTION OF THE INVENTION

Figure 1:
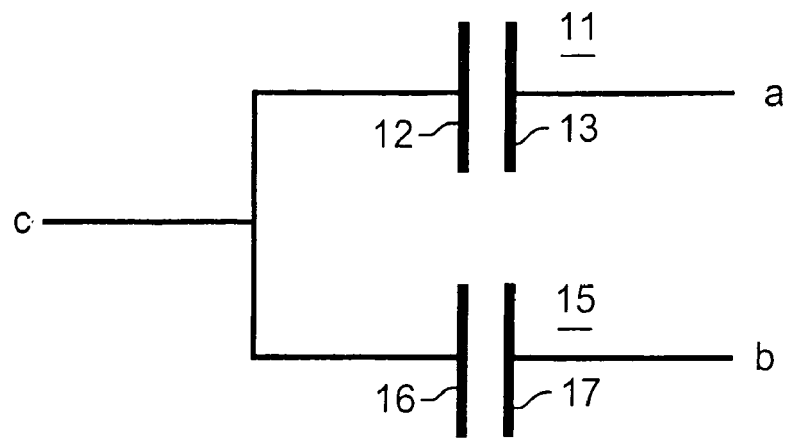
FIG. 1 is a simple circuit diagram for a capacitor pair of the invention.

FIG. 1 shows one circuit embodiment of the invention that will be used for the detailed description. Capacitors 11 and 15 may be connected in the configuration shown, with I/O connections a, b, and c. Capacitor 11 is formed by plates 12 and 13, and capacitor 15 is formed by plates 16 and 17. This capacitor pair is shown implemented using an interdigitated interconnect structure in FIG. 2. Substrate 21 represents any known IC substrate including but not limited to silicon, gallium arsenide, indum phosphide or an IPD substrate such as ceramic. The substrate is shown cut-away indicating that this is a portion, typically a small portion, of a larger substrate or wafer.

Figure 2:
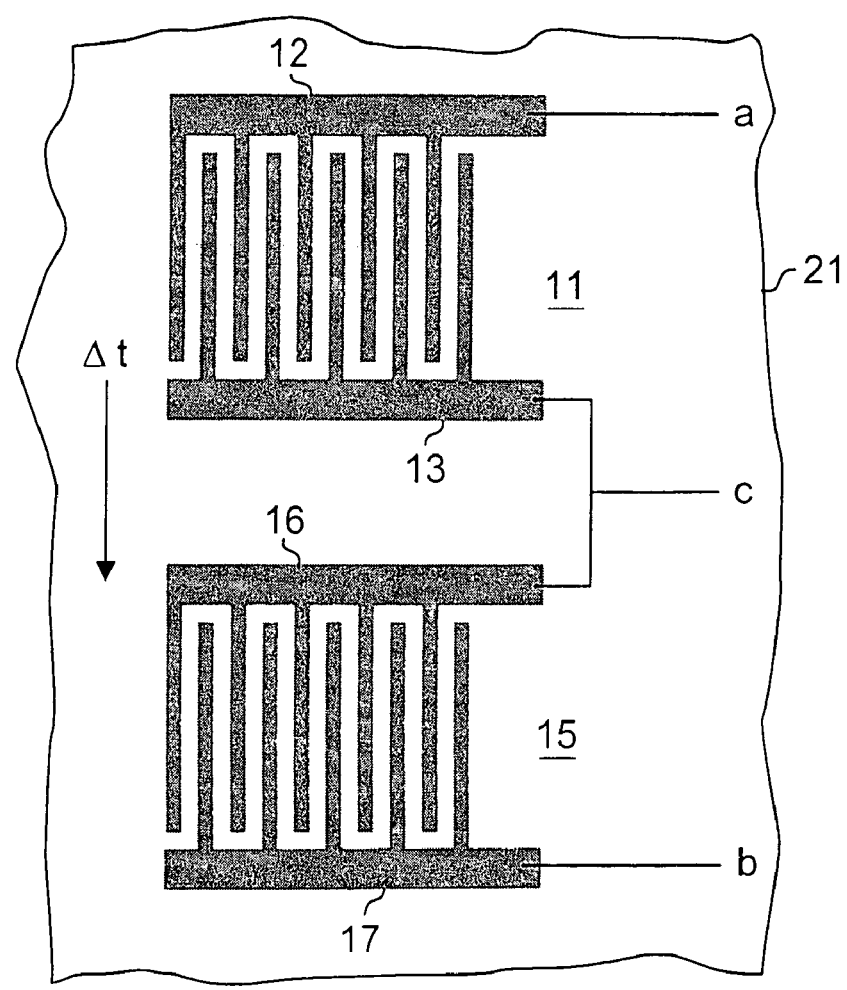
FIG. 2 is a schematic view showing an implementation of the capacitor pair using a prior art approach.

Due to processing variables, it is not uncommon for the thickness of the blanket layer that is patterned to form the discrete interdigitated devices 11 and 15 in FIG. 2 to vary over the surface of the substrate. In IC device manufacture, the substrate is typically a silicon wafer with a plurality of identical die formed in a repeated pattern on a surface of the wafer. State of the art wafers may be as large as 12" (300 mm) in diameter. Thousands of IC devices are produced from a single wafer. In IPD manufacture, the substrate is typically an insulating substrate, for example, ceramic. The device sites for IPDs are characteristically larger than for IC die or chips. In each case, any layer that is deposited over the whole substrate will vary in thickness in the x-y plane of the substrate or wafer. This thickness variation is indicated by the arrow, and "Δt", in the y or vertical direction of FIG. 2. Similar thickness variations also occur in an orthogonal, x direction of FIG. 2. It means that the layers that form capacitor 11 may have a thickness different from the layers that form capacitor 15. In that case the capacitance of capacitor 11 will be different from the capacitance of capacitor 15. If the variations indicated by Δt are significant, making a matched pair of capacitors will be difficult or impossible.

Figure 3:
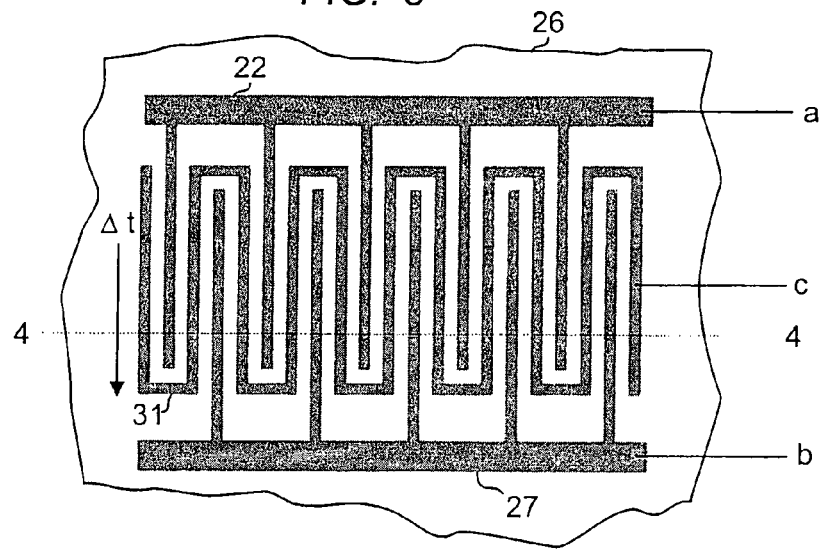
FIG. 3 is a schematic view of a capacitor pair constructed according to the invention.

An interdigitated capacitor pair with a common interleaved plate according to one embodiment of the invention is shown in FIG. 3. The substrate 26 may be an IC wafer, or an IPD substrate, the surface of which typically is covered with an insulating layer, for example $SiO_2$ for a silicon wafer. In this layout the electrode structure 22 corresponds approximately to electrode structure, or plate, 12 of FIGS. 1 and 2, and electrode structure 27 corresponds approximately to electrode structure, or plate 17 of FIGS. 1 and 2. Each capacitor plate 22 and 27 has a comb structure with the fingers of plate 22 interdigitated with the fingers of plate 27. Plates 13 and 16 of FIGS. 1 and 2 have been combined as a common interleaved plate 31. Interdigitated structure 22 is connected as node a, interdigitated structure 27 is connected as node b, and interleaved structure 31 is connected as node c.

As shown in FIG. 3, the spacing between edges of interleaved runner c and edges of the fingers of plates 22 and 27 (shown as "x" in FIG. 4) may be less than the spacing between edges of interleaved runner c and edges of the portions of plates 22 and 27 that do not form the fingers (shown as "p" in FIG. 3). Providing a different spacing in the two regions lessens the capacitance between the portions of interleaved runner c that provide direction reversals and the non-finger portions of plates 22 and 27, resulting in better control of the capacitance, and of the resulting matched capacitor pair. A recommended, but not required, range for the ratio p/x is 3 to 20.

The capacitor plates 12, 13, 16 and 17, are preferably formed from a single level of interconnect. It may be any convenient interconnect level. The metal may be any suitable conductive material, metal or compound, including but not limited to Al, Cu, Au, Ni, Ta, Ti, TaN, TiN, WN, Si, Pt, or combinations thereof for example suicides. From a process standpoint, it is most convenient to form the capacitor plates from the same metal used for interconnecting or fabricating other devices on the IC. A metal layer is blanket deposited on the substrate, or on any of the interlevel dielectric layers of the IC, and patterned by conventional photoresist techniques to form both the device interconnections for that level, and the capacitor plates shown in FIG. 3. If desired, and also within the scope of the invention, a separate step may be used to deposit and pattern a layer to form the capacitor plates. In that case a different metal may be used for the IC interconnects and the capacitor plates. Also within the scope of the invention is the use of different metals to form the various interdigitated structures of the capacitor. This option is most likely to be used in multi-level structures, such as those described in more detail below.

The interdigitated metal pattern shown in FIG. 3 is covered with a dielectric layer that fills the space between the interdigitated metal runners to form the dielectric between the capacitor plates, thus forming the capacitor pair. The dielectric layer may also serve as the interlevel dielectric between metal levels. For silicon wafers, preferably the dielectric layer is $SiO_2$, but other insulating materials, such as silicon nitride, or even a polymer such as polyimide, may be used. One skilled in the art would know what dielectric materials to use for other than silicon wafers.

Other step sequences may be used to reach the same or similar results. The blanket metal layer may be deposited, as well as a blanket dielectric layer, and the combined layers patterned to form the interdigitated structure. This may be a more likely sequence in producing IPDs. In the usual IC manufacturing process, where transistor devices are part of the IC structure, the metal layers are often patterned prior to depositing the interlevel dielectric. However, either of these step sequences, as well as others, is useful.

In state-of-the-art integrated circuits with, for example, a 0.13 micron design rule, the runners are very small and the space between interdigitated runners is small. Continuing the 0.13 micron design rule example, interdigitated runners 12, 13, 16 and 17 in FIG. 2 may have a width of 0.16 to 0.5 microns, a thickness of 0.2 to 1. micron, and a spacing of 0.18 to 0.55 microns.

The efficiency of the layout of the capacitor pair in FIG. 3, when compared with that of FIG. 2, is evident. Moreover, it is intuitively apparent that variations like $\Delta t$ will have an equivalent influence on both capacitors. This allows matched capacitor pairs to be produced even when process conditions cause significant variations in $\Delta t$.

Figure 4:
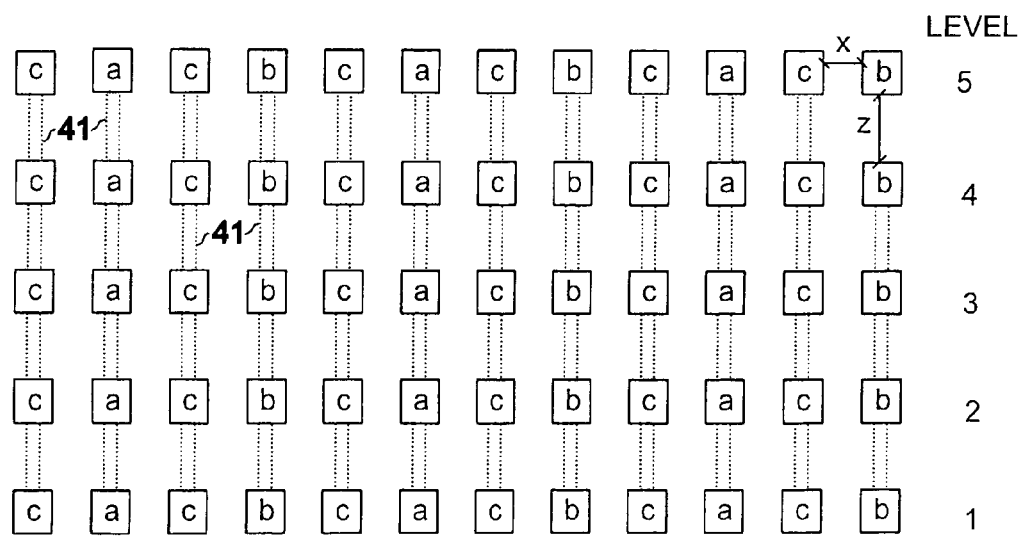
FIG. 4 is a schematic diagram of a stacked capacitor using the configuration of FIG. 3.

FIG. 3 as shown may be a single level capacitor, or it may have additional levels above or below that shown where added capacitors may be stacked. A stacked interdigitated device is represented in the schematic of FIG. 4. The levels 1-5 indicate levels of metalization in an IC or IPD device. The first level, the first layer that is formed on the substrate (not shown), is the bottom level of the finished structure. In FIG. 4, the first level corresponds to a section through 4-4 of FIG. 3. For clarity, not all of the runners that appear in FIG. 3 are depicted in FIG. 4, but the pattern is evident. Each subsequent level is formed as shown. Typically each level will be identical to, or similar to, the level shown in FIG. 3.

The stacked device embodiment may be used for at least two useful options. The matched capacitor pair at each level may be utilized in an IC or IPD and interconnected with other devices thereon as a separate matched pairs of capacitors, meaning that five separate matched pairs of capacitors may be formed in the same die area that is occupied by the device of FIG. 4. This option offers the possibility that each matched pair of capacitors may be different physically than the matched pair of capacitors of the other layers such as having a different interdigitated structure resulting in different capacitance than the matched pairs of capacitors of the other layers. Another option for this structure is to interconnect the "a" plates from each level, as well as the "b" and "c" plates respectively. When the capacitance of the matched pair of capacitors of each level are identical, this results in a matched capacitor pair with n times the capacitance of a matched pair of capacitors made on a single level. In FIG. 4, n is five as five levels are illustrated. A convenient method for implementing this embodiment is to provide through hole interconnections between corresponding plates of adjacent levels. In FIG. 4, interconnections between corresponding plates at each level 1-5 are shown at 41.

For the purpose of illustration only, five metalization levels are represented in the IC device depicted in FIG. 4. That suggests that the IC device depicted has at least five-level metalization. Obviously, the IC may have more or fewer levels of metal, all or less than all of the metalization layers may be used to fabricate matched capacitors. Alternatively, the matched capacitor pair shown may be part of a passive device section on the IC chip, a section that may have as many levels of metal as are convenient for fabrication of the passive device structures, independent of the metal levels in the active device region(s). The same holds true for IPDs, where the number of levels in the stacked multi-level matched capacitor pair device may be whatever is needed or convenient.

Figure 5:
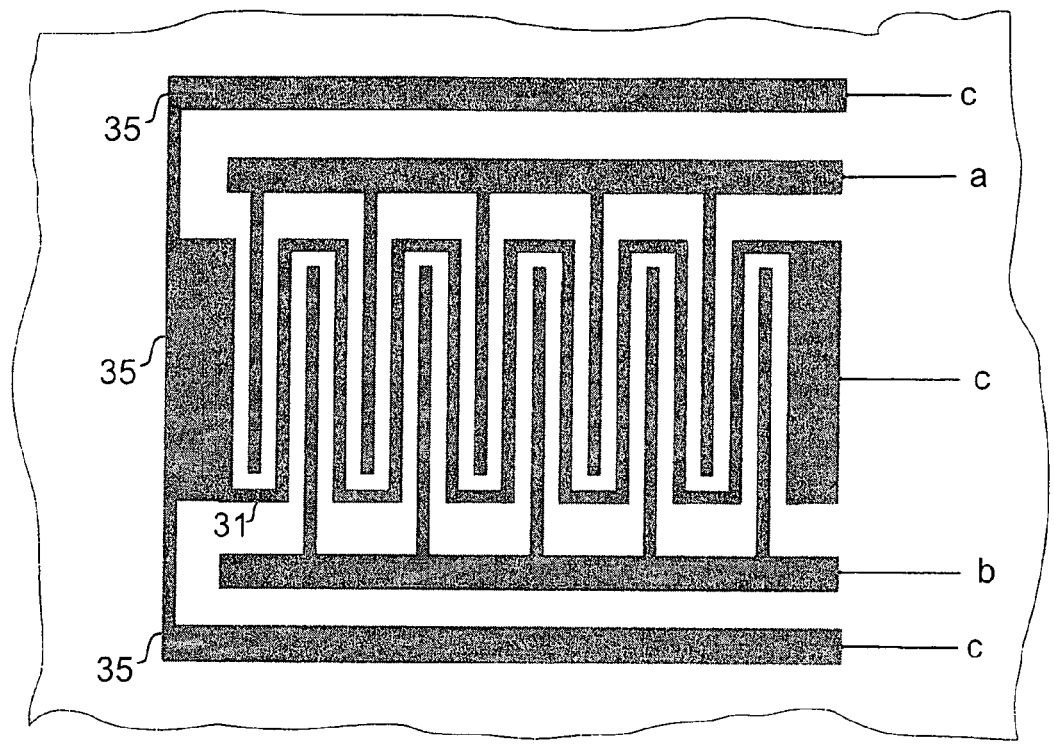
FIGS. 5-8 and 10 are schematic views similar to that of FIG. 3 showing alternative embodiments of the invention.

FIG. 3 shows the matched capacitor pair a-c and b-c connected to other devices on the integrated circuit (or to I/O leads in an IPD) at one end of the capacitor pair. To improve high frequency performance it may be helpful to have distributed connections to the matched capacitor pair. FIG. 5 shows the matched capacitor pair of FIG. 3 with interconnections 35 to the "back" of the capacitor structure.

Figure 6:
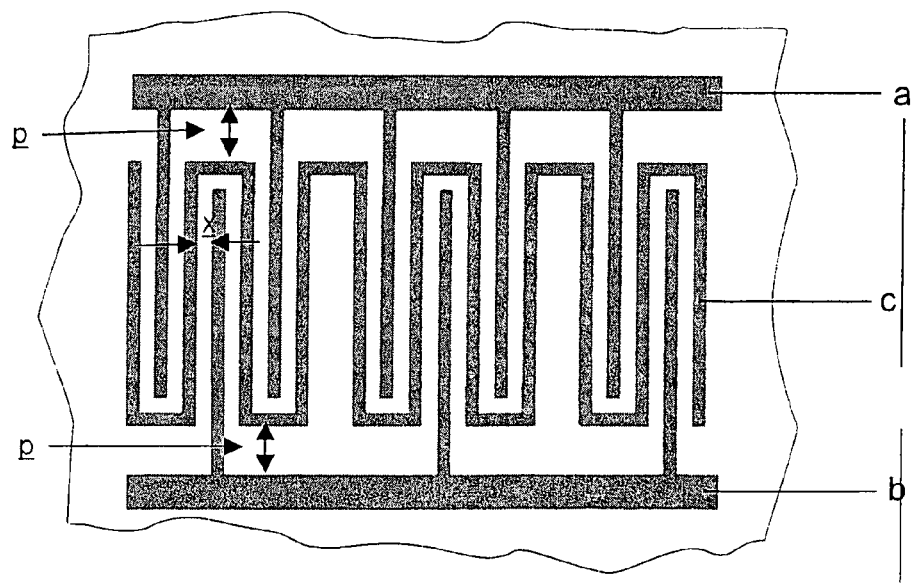
Figure 7:
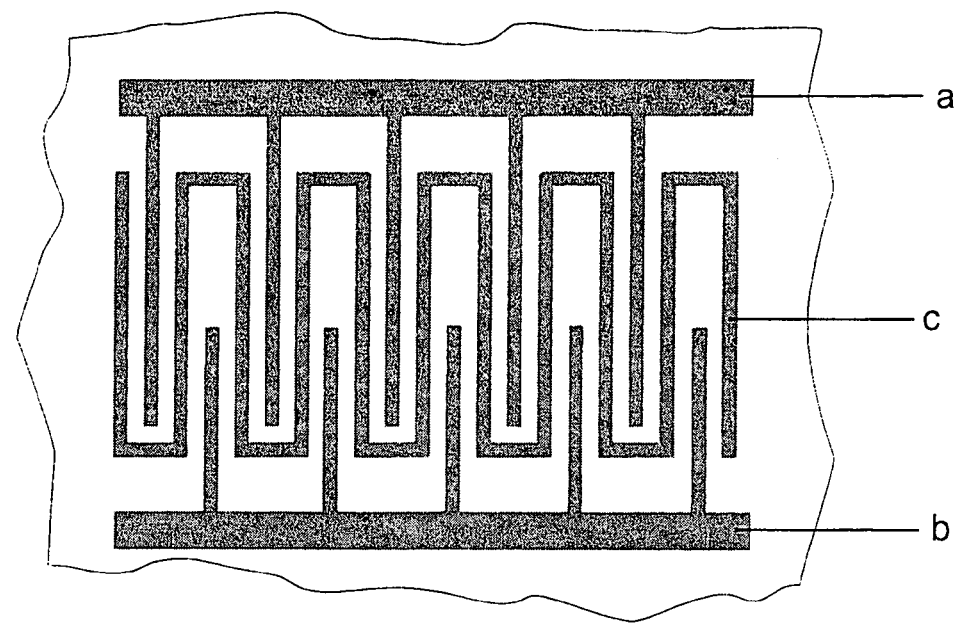

The matched capacitor pair structures according to the invention offer convenient means for adjusting the capacitance ratio of capacitance a-c to capacitance b-c. The above illustrations have had a one-to-one ratio resulting in a matched capacitor pair. The ratio is varied by simply omitting a portion of the length of one of the interdigitated runners. FIG. 6 shows a capacitor pair similar to that of FIG. 3, but with five interdigitated runners for capacitor a-c, and only three interdigitated runners for capacitor b-c. This yields a capacitor ratio a-c to b-c of five to three. Whole finger portions of runners may be eliminated to adjust the ratio, as shown in FIG. 6, or as shown in FIG. 7, fractional parts of finger portions of runners may be left out, i.e. the finger portions of runners for one of the plates may simply be made shorter than the finger portions of runners for the other plate. In the embodiment shown in FIG. 7, where the finger portions of runners for plate b are shorter (in the y-direction) than the finger portions of runners for plate a, the capacitance ratio a-c to b-c is the ratio of the length of the fingers of runner a overlap with runner c, to the length of the fingers of runner b overlap with runner c. The resulting capacitors provide a proportional matched pair of capacitors. The proportional matched capacitor pairs of FIGS. 6 and 7 may also be designed with the plate-interleaved runner spacing shown in FIG. 3 and the discussion thereof.

As described in connection with FIG. 3, the dimension "p" in FIG. 3 should exceed dimension "x" in FIG. 4 in the manner described earlier. In the embodiment of FIG. 6, this allows greater control over the ratio of capacitances between the capacitor pair.

In some circuit applications, the use of a common capacitor plate, i.e. plate 31 of FIG. 3, may be undesirable. A variety of options for splitting the common plate are available. Two of these are shown in FIGS. 8 and 10 respectively.

Figure 8:
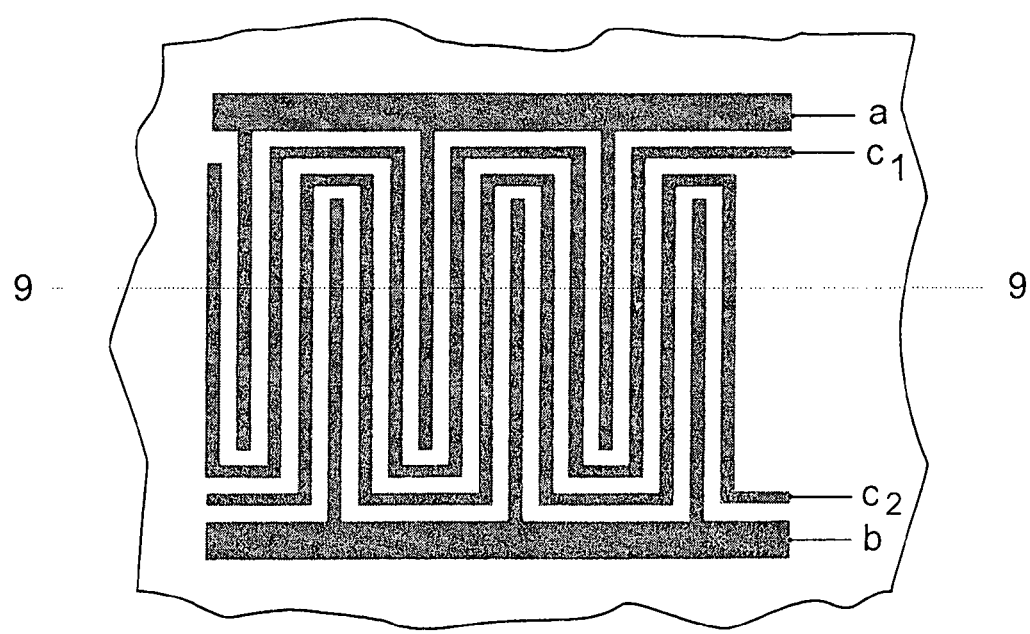

FIG. 8 shows a matched capacitor pair with two interleaved intermediate plates, $c_1$ and $c_2$. This structure allows the more familiar four electrode interconnection for the capacitor pair. The circuit may be designed to allow for the small capacitive coupling between $c_1$ and $c_2$, or the space separating $c_1$ and $c_2$ may be suitably enlarged.

Figure 9:
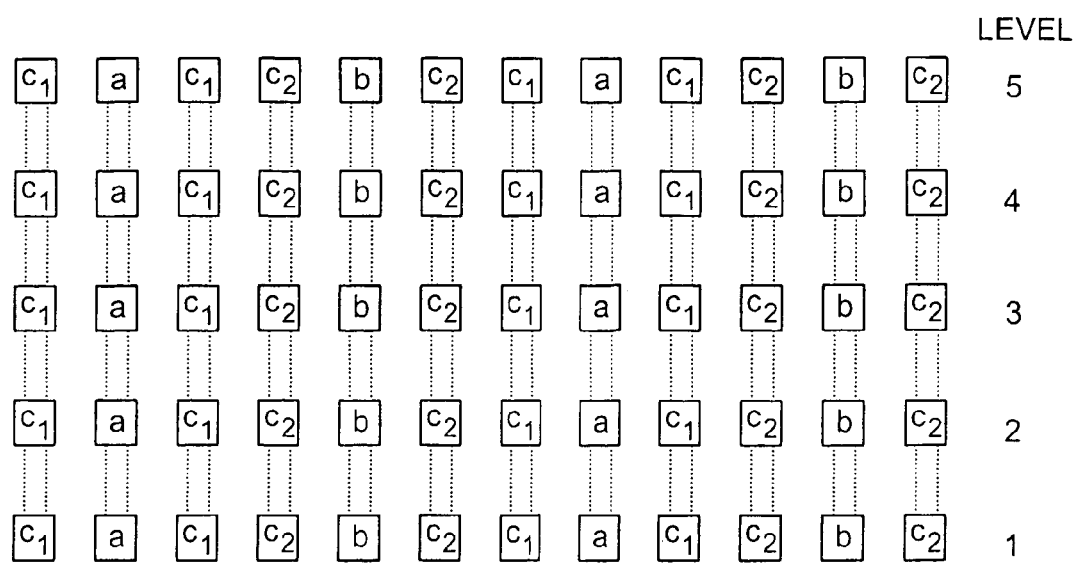
FIGS. 9 and 11 are section views of stacked capacitors using the basic configuration of FIGS. 9 and 11 respectively.

FIG. 9 shows a stacked version of the matched capacitor pair of FIG. 8. Again, five levels are shown, with corresponding plates, and plates that are vertically aligned are interconnected by vias. As pointed out earlier, the vias are one option, as is the repetition of the pattern between levels. Other arrangements may be used wherein the capacitance of the matched capacitor pairs differ between levels or where the plates on adjacent levels differ. Among other options are to place resistors and/or inductors at some levels. In this manner whole IPD circuits may be built using two or more levels. Or levels with passive device circuits may be used with levels with active devices.

Figure 10:
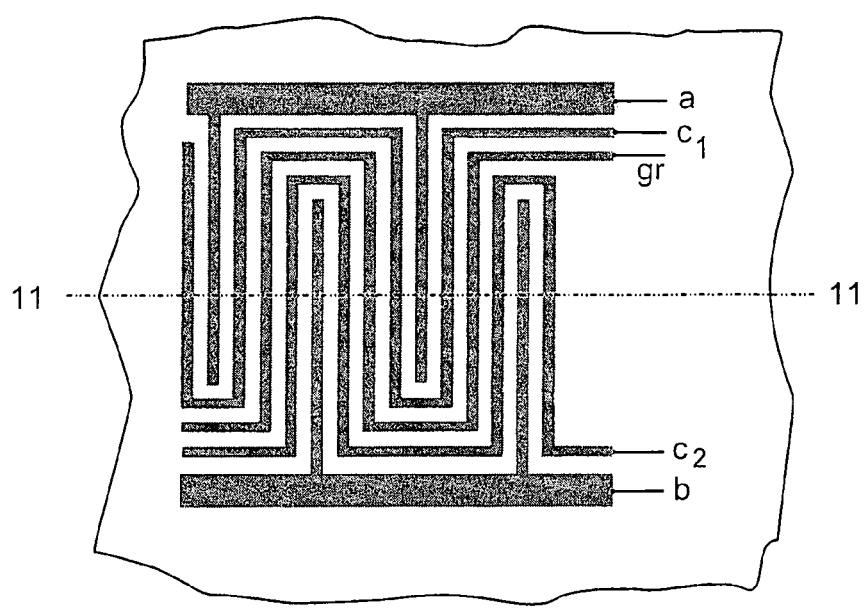

FIG. 10 shows yet another embodiment wherein two interleaved interior capacitor plates are provided, thus providing two plates where there is a common interleaved plate 31 of FIG. 3. It will be recognized that the embodiment of FIG. 10 is similar to that of FIG. 8, but the capacitive coupling between $c_1$ and $c_2$ is eliminated by a ground plane "gr". The ground plane comprises an interleaved runner typically of the same material and dimensions as the runners $c_1$ and $c_2$. The matched capacitor of FIG. 10 shares the virtues of the embodiment of FIG. 3 in terms of reduced susceptibility to $\Delta t$ for example, but with the added feature that it has a true four-node design, a, b, $c_1$ and $c_2$, and the two capacitors are electrically isolated from one another.

Figure 11:
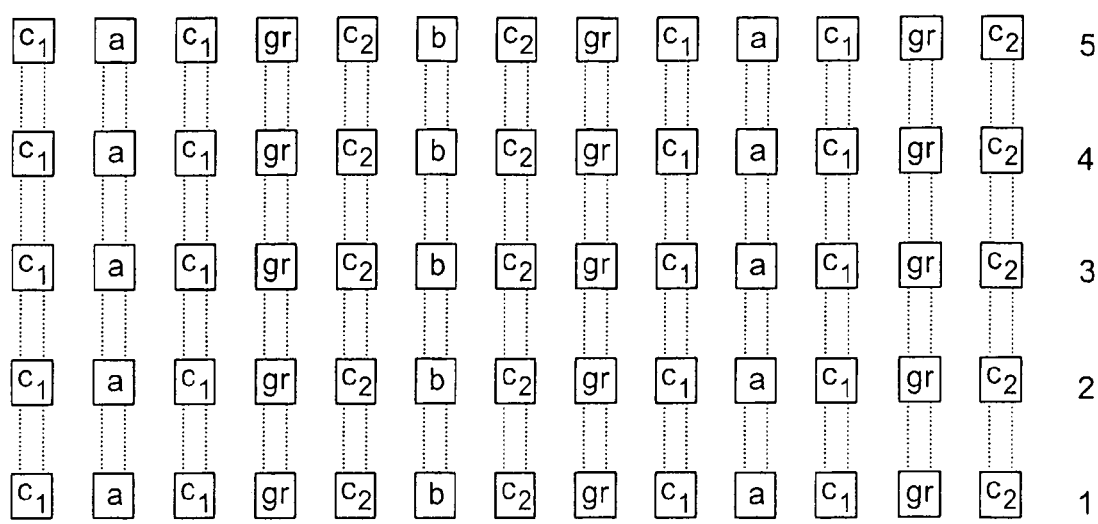

A stacked version of the matched capacitor of FIG. 10 is shown in FIG. 11, with the ground plane "gr" isolating the interior plates $c_1$ and $c_2$. Although this embodiment is slightly more complex than that of FIG. 4, the electrical performance may be more suitable for some circuit applications.

The matched capacitor pairs of FIGS. 8 and 10 may also be designed with different capacitances, resulting in a proportional matched pair of capacitors, using the techniques shown in FIG. 6 or FIG. 7 and the discussion thereof, or the plate-interleaved runner spacing shown in FIG. 3 and the discussion thereof.

The conductors that form the capacitor plates are referred to as runners. It will be recognized that in the capacitor structures of the invention, the edges or sides of the runners form the capacitor surfaces. Thus, increasing the width of the runners does not increase capacitance. Therefore, for space efficiency, the runners should be designed with a width the same as any other portion of the metalization that serves an interconnection function. That width will typically be the minimum dimension allowed by the design rule. The thickness of the runners does contribute to the capacitor value. However, an advantage of the devices described above is that they may be formed as part of the metalization levels already used to manufacture the IC device. In that case the thickness of the runners will have a thickness determined by the process design. That restriction may not be the case in IPD production. Here the runner thickness may be adjusted to suit the capacitor design. Taking all these factors into account, the aspect ratio, width/thickness, for the runners in the devices described here will most typically be in the range of 3 to 0.5. Other ratios may be found useful. It is noted here that the ratio of width to thickness of these runners will also affect the capacitor density, an additional factor to be taken into account.

The structures described herein have features that are easily described heuristically, but a precise prescription of the generic base of the invention may be aided by additional definitions.

Each of the capacitor plates in the embodiments described comprises a main runner, and a plurality of side runners extending from the main runner to form a comb structure. The comb structure is evident in each of FIGS. 3, 5, 6, 7, 8, and 10. The side runners are analogous to the teeth of the comb, but in the context of an interdigitated arrangement, are referred to here as fingers of the comb.

Among other features of the invention the matched capacitor pairs and proportional matched capacitor pairs described herein comprise at least three capacitor plates, with two of the capacitor plates each having a comb structure, and the fingers of one comb structure interdigitated with the fingers of the other comb structure. The third capacitor plate extends, or is interleaved, between the two interdigitated plates. According to a common interpretation, the term interdigitated describes fingers from two sources that extend between each other with every other finger originating from a first one of the two source and the alternate fingers originating from the second of the two sources. With the outer plates of the capacitor defined above as having a comb structure, the devices may be described simply as a two-comb structure with the fingers of the combs interdigitated.

The interdigitated fingers and interleaved capacitor plate have a spacing therebetween. Because design rules change, it is preferable to prescribe the spacing as a ratio. Although other spacings may be used, a recommended spacing "s", as a ratio with the runner width "w", is:

$$s=0.5 \text{ to } 3.0 \text{ w.}$$

Another feature common to the embodiments shown is that runners that form at least some of the capacitor plates are boustrophedonic, that is, they follow a meandering or back-and-forth path. These are runners $c_1$, $c_2$, and the ground runner gr (FIG. 10). The boustrophedonic path changes direction in 90° increments, and to form a matched capacitor pair or a proportional matched pair of capacitors in a configuration according to the invention requires at least two path changes. Thus in the context of the invention, a meandering or boustrophedonic path may be defined as one that turns through at least 180°. It is noted that the paths shown in the figures comprise straight sections. Other options may be found useful.

The various configurations of the invention may alternatively be described by reference to the section views. Thus the capacitor pair shown in FIG. 3 comprises a planar structure having a plurality of runners, with a cross section normal to the runners having alternating runners in the sequence a, c, b, c, a, . . . wherein runners a, b, c are separated by insulator, and are, respectively, interconnected.

The process steps for forming the structures described are conventional and straightforward. The fundamental steps comprise providing a substrate, the substrate either insulating, or covered with an insulating layer, depositing a metal layer on the substrate, and patterning the metal layer to form the metal runners. The metal may be deposited by any of a variety of known techniques, including evaporation, sputtering, plating, and chemical vapor deposition (CVD). The deposited metal layer may be patterned by conventional photolithography. To take advantage of the process compatibility feature of the invention, all of the metal patterns forming the capacitor plates may be formed in a single patterning operation. In addition, for IC manufacture, that single patterning operation forms the metalization pattern that is used to interconnect other elements of the integrated circuit on a given metalization level. The term "other elements" is meant to include resistors, inductors, transistors, diodes, etc.

The matched capacitor pairs or proportional matched capacitor pairs fabricated as described above are fabricated as part of an IPD or a die and are interconnected to other components on the IPD or if on a die are interconnected to other components on the wafer. A plurality of identical die are typically formed in a repeated pattern on a surface of the wafer. The individual die are cut or diced from the wafer, then packaged as an integrated circuit. One skilled in the art would know how to dice wafers and package die to produce integrated circuits. Integrated circuits so manufactured including matched capacitor pairs or proportional matched capacitor pairs are considered part of this invention.

While the invention has been described mostly with respect to processing silicon wafers, the invention is not limited thereto. The invention may be formed using other processing technologies including but not limited to processing technologies to fabricate matched capacitor pairs or proportional matched capacitor pairs in gallium arsenide and indium phosphide wafers.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. A capacitor pair device including a first capacitor and a second capacitor, comprising:
   a. a substrate,
   b. a first conductive comb structure on the substrate forming another plate of the first capacitor of the capacitor pair,
   c. a second conductive comb structure on the substrate forming a plate of the second capacitor of the capacitor pair, the second conductive comb structure interdigitated with the first conductive comb structure, and
   d. a continuous conductive runner on the substrate interleaved between the first conductive comb structure and the second conductive comb structure, the continuous conductive runner forming the first capacitor with the first conductive comb structure and the second capacitor with the second conductive comb structure, thus forming the capacitor pair.

2. The device of claim 1 wherein the capacitor pair is a first level capacitor pair, and the device includes an insulating layer on the capacitor pair, and further includes a second level capacitor pair formed on the insulating layer.

3. The device of claim 2 wherein the first level capacitor pair is interconnected with the second level capacitor pair.

4. The device of claim 1 wherein the capacitor pair device comprises an integrated circuit.

5. A capacitor pair device including a first capacitor and a second capacitor comprising:
   a. a substrate,
   b. a first conductive comb structure on the substrate forming a plate of the first capacitor of the capacitor pair,
   c. a second conductive comb structure on the substrate forming another plate of the second capacitor of the capacitor pair, the second conductive comb structure interdigitated with the first conductive comb structure,
   d. a first continuous conductive runner on the substrate interleaved between the first conductive comb structure and the second conductive comb structure, the first continuous conductive runner forming the first capacitor with the first comb structure,
   e. a second continuous conductive runner on the substrate parallel to the first continuous conductive runner, and interleaved between the first continuous conductive runner and the second conductive comb structure, the second continuous conductive runner forming the second capacitor with the second conductive comb structure, thus forming the capacitor pair.

6. The device of claim 5 wherein the capacitor pair is a first level capacitor pair, and the device includes an insulating layer on the capacitor pair, and further includes a second level capacitor pair formed on the insulating layer.

7. The device of claim 6 further including a ground plane on the substrate between the first continuous runner and the second continuous runner.

8. The device of claim 7 wherein the capacitor pair is a first level capacitor pair, and the device includes an insulating layer on the capacitor pair, and further includes a second level capacitor pair formed on the insulating layer.

9. The device of claim 8 wherein the first level capacitor pair is interconnected with the second level capacitor pair.

10. The device of claim 7 wherein the first continuous conductive runner, the second continuous conductive runner and the ground plane, each follow a parallel meandering path.

11. The device of claim 10 wherein the meandering path turns at least 180°.

12. The device of claim 11 wherein the meandering path includes at least two 90° turns.

13. The device of claim 7 wherein the fingers of the first and second conductive comb structures, the first and second continuous runners, and the ground plane, all have essentially the same thickness.

14. The device of claim 13 wherein the fingers of the first and second conductive comb structures, the first and second continuous runners, and the ground plane, all have essentially the same width.

* * * * *